US009107019B2

(12) United States Patent
Lee et al.

(10) Patent No.: US 9,107,019 B2
(45) Date of Patent: Aug. 11, 2015

(54) SIGNAL PROCESSING APPARATUS AND METHOD FOR PROVIDING SPATIAL IMPRESSION

(75) Inventors: Kang Eun Lee, Hwaseong-si (KR); Shi Hwa Lee, Seoul (KR); Do Hyung Kim, Hwaseong-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 477 days.

(21) Appl. No.: 13/542,193

(22) Filed: Jul. 5, 2012

(65) Prior Publication Data

US 2013/0034235 A1 Feb. 7, 2013

(30) Foreign Application Priority Data

Aug. 1, 2011 (KR) ........................ 10-2011-0076657

(51) Int. Cl.
*H03G 3/00* (2006.01)
*H04S 3/00* (2006.01)
*H04S 7/00* (2006.01)

(52) U.S. Cl.
CPC ................. *H04S 3/008* (2013.01); *H04S 7/305* (2013.01)

(58) Field of Classification Search
CPC ............ H04S 1/002; H04S 5/00; G10K 15/12
USPC ...................................................... 381/17, 63
See application file for complete search history.

(56) References Cited

U.S. PATENT DOCUMENTS

| | | | | |
|---|---|---|---|---|
| 5,812,674 | A * | 9/1998 | Jot et al. | 381/17 |
| 7,099,482 | B1 * | 8/2006 | Jot et al. | 381/61 |
| 2008/0205675 | A1 * | 8/2008 | Kutuzov et al. | 381/309 |

FOREIGN PATENT DOCUMENTS

| | | |
|---|---|---|
| JP | 5-232979 | 9/1993 |
| JP | 6-130942 | 5/1994 |
| JP | 6-259087 | 9/1994 |
| JP | 7-104775 | 4/1995 |
| JP | 7-121189 | 5/1995 |
| JP | 10-66199 | 3/1998 |
| JP | 2002-221975 | 8/2002 |
| JP | 2003-5770 | 1/2003 |
| KR | 1997-0004173 | 1/1997 |
| KR | 1997-0004178 | 1/1997 |
| KR | 2001-0029508 | 4/2001 |
| KR | 10-2010-0081101 | 7/2010 |
| KR | 10-2010-0137912 | 12/2010 |

* cited by examiner

*Primary Examiner* — Simon King
(74) *Attorney, Agent, or Firm* — Staas & Halsey LLP

(57) ABSTRACT

A signal processing apparatus and method for providing a spatial impression. The signal processing apparatus applies a reverberation effect to a summed signal formed by summing original signals corresponding to locations of a plurality of sound sources, and removes a correlation from the summed signal, thereby generating reverberation signals corresponding to the locations of the plurality of sound sources. Next, the signal processing apparatus applies panning information derived from the original signals, thereby reflecting location information of the original signals.

18 Claims, 11 Drawing Sheets

SIGNAL PROCESSING APPARATUS AND METHOD FOR PROVIDING SPATIAL IMPRESSION

CROSS-REFERENCE TO RELATED APPLICATIONS

This application claims the priority benefit of Korean Patent Application No. 10-2011-0076657, filed on Aug. 1, 2011, in the Korean Intellectual Property Office, the disclosure of which is incorporated herein by reference.

BACKGROUND

1. Field

Example embodiments of the following description relate to a signal processing apparatus and method providing a spatial impression, and more particularly, to an apparatus and method for increasing a spatial impression of an original signal by artificially adding a reverberation effect to the original signal.

2. Description of the Related Art

As audio devices continue to develop rapidly, a demand for providing a spatial impression to sound is increasing. To provide the spatial impression to sound, generally, a reverberation effect is artificially added to an original signal. In this case, a listener may feel as if the sound is being listened to in a concert hall. That is, the spatial impression may be provided to the listener by intentionally adding the reverberation effect to an original signal, such that the listener may feel as if the sound quality is similar to that of a concert hall.

Examples of conventional methods for adding the reverberation effect to the original signal will be introduced.

In a first example of a conventional method, a signal processing apparatus may generate a left reverberation signal and a right reverberation signal, by applying the reverberation effect to a left original signal and a right original signal, respectively, both of which are stereo signals. Next, the conventional signal processing apparatus generates a final left signal by summing the left original signal and the left reverberation signal with a proper ratio, and generates a final right signal by summing the right original signal and the right reverberation signal with a proper ratio.

According to this method, directivity of the left original signal and the right original signal may be maintained since the reverberation effect is independently applied to the left original signal and the right original signal. However, a large memory capacity is required to apply the reverberation effect to both the left original signal and the right original signal. In particular, because the first example method requires a rather large memory capacity, it is inappropriate for a mobile device, which is strictly limited in terms of resources.

The second example of a conventional method provides a signal processing apparatus, which may sum the left original signal with the right original signal, and then apply the reverberation effect to the summed signal. Next, the signal processing apparatus may delay the summed signal to which the reverberation effect is applied, and perform orthogonal summing between a delayed summed signal and a non-delayed summed signal, thereby generating the left original signal and the right original signal.

According to the second example conventional method, a smaller memory capacity is required, as compared to the memory capacity required in the first example conventional method, since the reverberation effect is applied to the summed signal. Also, the second conventional method is less complicated. However, directivity of the signals may be damaged because the reverberation effect is applied with the same ratio irrespective of a difference in sound pressure between the left original signal and the right original signal.

Accordingly, when the reverberation effect is applied to provide a spatial impression to an original signal, a method that requires a relatively small memory while maintaining directivity of the original signal is demanded.

SUMMARY

The foregoing and/or other aspects are achieved by providing a signal processing apparatus, including a reverberation effect application unit to apply a reverberation effect to a summed signal formed by summing original signals that correspond to locations of an N-number of sound sources, and a decorrelation unit to extract reverberation signals corresponding to the locations of the N-number of sound sources, by removing correlation from a feedback delay network (FDN) channel signal applied with the reverberation effect.

The foregoing and/or other aspects are achieved by providing a signal processing apparatus, including a reverberation effect application unit to apply a reverberation effect to a summed signal formed by summing original signals that correspond to locations of an N-number of sound sources, a decorrelation unit to extract reverberation signals corresponding to the locations of the N-number or sound sources, by removing correlation from an FDN channel signal applied with the reverberation effect, a panning information determination unit to determine panning information of the respective original signals corresponding to the locations of the N-number of sound sources, and a panning information application unit to apply the panning information to the respective reverberation signals corresponding to the locations of the N-number of sound sources.

The foregoing and/or other aspects are achieved by providing a signal processing method, including applying a reverberation effect to a summed signal formed by summing original signals that correspond to locations of an N-number of sound sources, and extracting reverberation signals corresponding to the locations of the N-number of sound sources, by removing correlation from an FDN channel signal applied with the reverberation effect.

The foregoing and/or other aspects are also achieved by providing a signal processing method including applying a reverberation effect to a summed signal formed by summing original signals that correspond to locations of an N-number of sound sources, extracting reverberation signals corresponding to the locations of the N-number of sound sources, by removing correlation from an FDN channel signal applied with the reverberation effect, determining panning information of the respective original signals corresponding to the locations of the N-number of sound sources, and applying the panning information to the respective reverberation signals corresponding to the locations of the N-number of sound sources.

The foregoing and/or other aspects are also achieved by providing a signal processing method, including increasing a spatial impression of one or more original signals by adding a reverberation effect to the one or more original signals; extracting reverberation signals by removing correlation from an FDN channel signal to which the reverberation effect is applied; and maintaining a directivity of the one or more original signals by applying panning information of the one or more original signals to the reverberation signals.

According to example embodiments, a reverberation effect is applied after original signals corresponding to locations of an N-number of sound sources are summed. Therefore, a memory capacity necessary for the reverberation effect may be reduced.

Also, according to example embodiments, since panning information related to location information of the original signals are applied to the reverberation signals to which the reverberation effect is applied, directivity of the sound sources may be maintained.

Also, according to example embodiments, temporal smoothing is applied to panning information between frames. Accordingly, a noise caused by a sudden difference in the panning information between frames may be prevented.

Additional aspects, features, and/or advantages of example embodiments will be set forth in part in the description which follows and, in part, will be apparent from the description, or may be learned by practice of the disclosure

BRIEF DESCRIPTION OF THE DRAWINGS

These and/or other aspects and advantages will become apparent and more readily appreciated from the following description of the example embodiments, taken in conjunction with the accompanying drawings of which.

DETAILED DESCRIPTION

Figure 1:
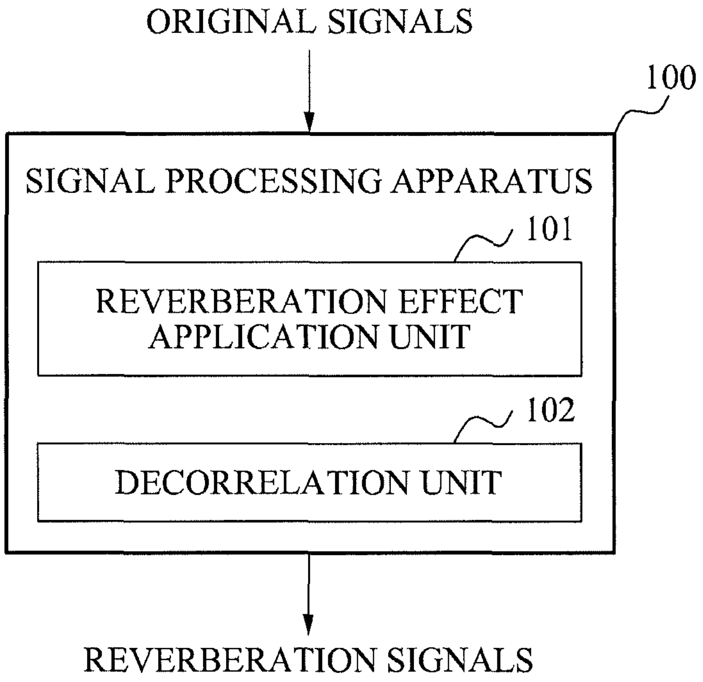
FIG. 1 illustrates a signal processing apparatus, according to example embodiments.

Reference will now be made in detail to example embodiments, examples of which are illustrated in the accompanying drawings, wherein like reference numerals refer to the like elements throughout. Example embodiments are described below to explain the present disclosure by referring to the figures.

FIG. 1 illustrates a signal processing apparatus 100, according to example embodiments.

Referring to FIG. 1, the signal processing apparatus 100 may include a reverberation effect application unit 101 and a decorrelation unit 102.

The reverberation effect application unit 101 may apply a reverberation effect to a summed signal formed by summing original signals corresponding to locations of an N-number of sound sources. For example, the reverberation effect application unit 101 may use an N-th feedback delay network (FDN) in applying the reverberation effect.

According to example embodiments, a relatively small memory capacity is required since the reverberation effect is applied to a summed signal formed by summing the original signals corresponding to locations of an N-number of channels.

The decorrelation unit 102 may extract reverberation signals corresponding to the locations of the N-number of sound sources, by removing a correlation from an FDN channel signal to which the reverberation effect is applied. For example, the decorrelation unit 102 may apply a delay to the summed signal to which the reverberation effect is applied, to thereby extract the reverberation signals corresponding to the locations of the N-number of sound sources.

Figure 2:
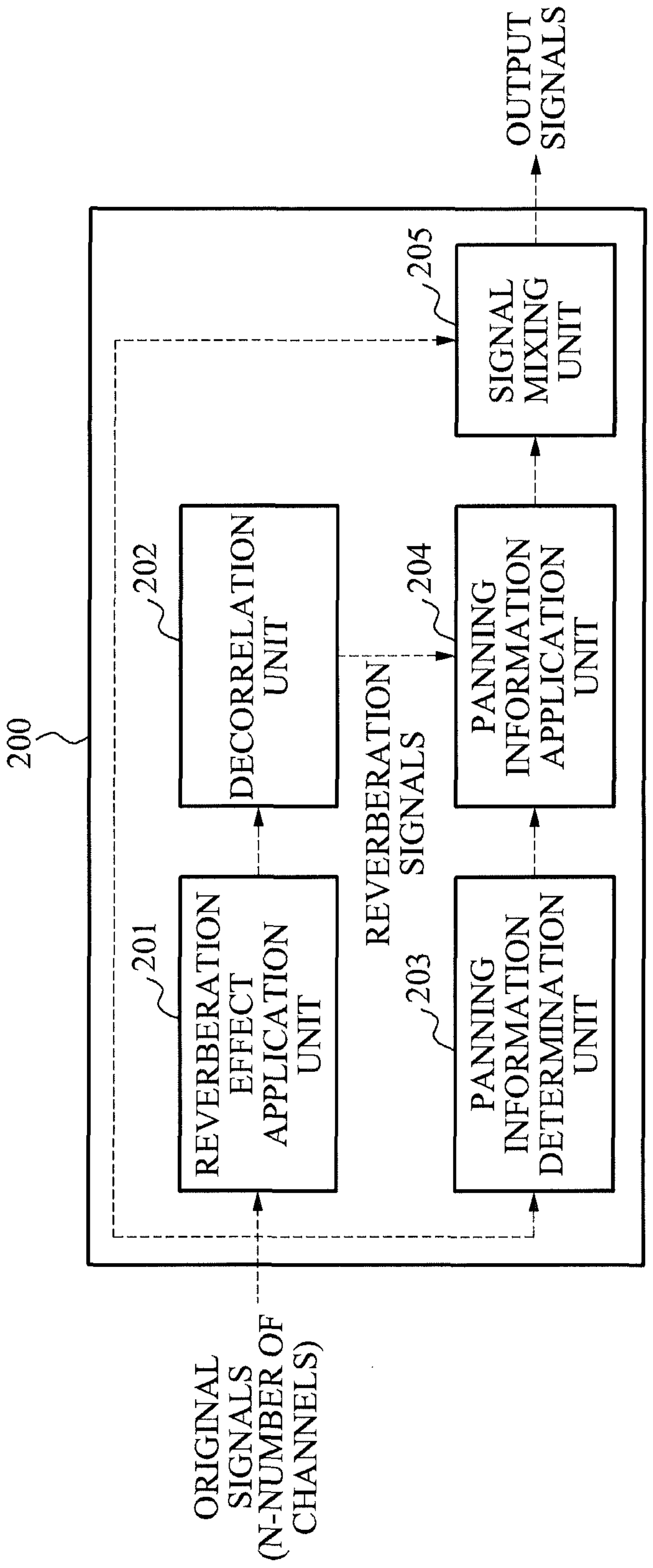
FIG. 2 illustrates a signal processing apparatus, according to other example embodiments.

FIG. 2 illustrates a signal processing apparatus 200, according to other example embodiments.

Referring to FIG. 2, the signal processing apparatus 200 includes a reverberation effect application unit 201, a decorrelation unit 202, a panning information determination unit 203, and a panning information application unit 204. Depending on embodiments, a signal mixing unit 205 may be further included.

The reverberation effect application unit 201 may apply a reverberation effect to the summed signal formed by summing original signals corresponding to locations of an N-number of sound sources. For example, the reverberation effect application unit 201 may use an N-th FDN in applying the reverberation effect.

The decorrelation unit 202 may extract reverberation signals corresponding to the locations of the N-number of sound sources, by removing a correlation from an FDN channel signal applied with the reverberation effect. For example, the decorrelation unit 202 may apply a delay to the FDN channel signal applied with the reverberation effect, in order to extract the reverberation signals corresponding to the locations of the N-number of sound sources.

The panning information determination unit 203 may determine panning information of the respective original signals that correspond to the locations of the N-number of sound sources. Here, the panning information may refer to a panning coefficient, that is, information on location information of the original signals. For example, the panning information determination unit 203 may determine the panning information representing directivity of the original signals using energies of the respective original signals that correspond to the locations of the N-number of sound sources. In this case, the panning information determination unit 203 may determine the panning information of the original signals for each frame of each of the original signals.

The panning information application unit 204 may apply the panning information to the respective reverberation signals corresponding to the locations of the N-number of sound sources. Here, the reverberation signals refer to signals derived from the decorrelation unit 202. That is, the panning information application unit 204 may reflect directivity of the original signals to the reverberation signals, by applying the panning information to the respective reverberation signals.

When a difference in panning information between frames exceeds a predetermined reference value, and thus, transition occurs, the panning information application unit 204 may apply temporal smoothing to the panning information between frames. By applying the panning information applied with the temporal smoothing to the reverberation signals, the panning information application unit 204 may reduce noise caused by the transition. In addition, the panning information application unit 204 may apply nonlinear mapping to the panning information to which the temporal smoothing is applied. The nonlinear mapping is performed to limit a maximum value and a minimum value of panning while adjusting a panning intensity.

The signal mixing unit 205 may mix the original signals corresponding to the locations of the N-number of sound sources with the reverberation signals applied with the panning information. Accordingly, the signal mixing unit 205 may derive final signals corresponding to the N-number of channels.

The signal processing apparatuses 100 and 200, as illustrated in FIGS. 1 and 2, may be serially added after a sound source generation device, to provide a spatial impression to an audio signal generated from a portable media content reproducing device, a mobile terminal, and the like. In addition, the signal processing apparatuses 100 and 200 may be implemented as a chip to be built in the portable media content reproduction device, the mobile terminal, and the like.

Figure 3:
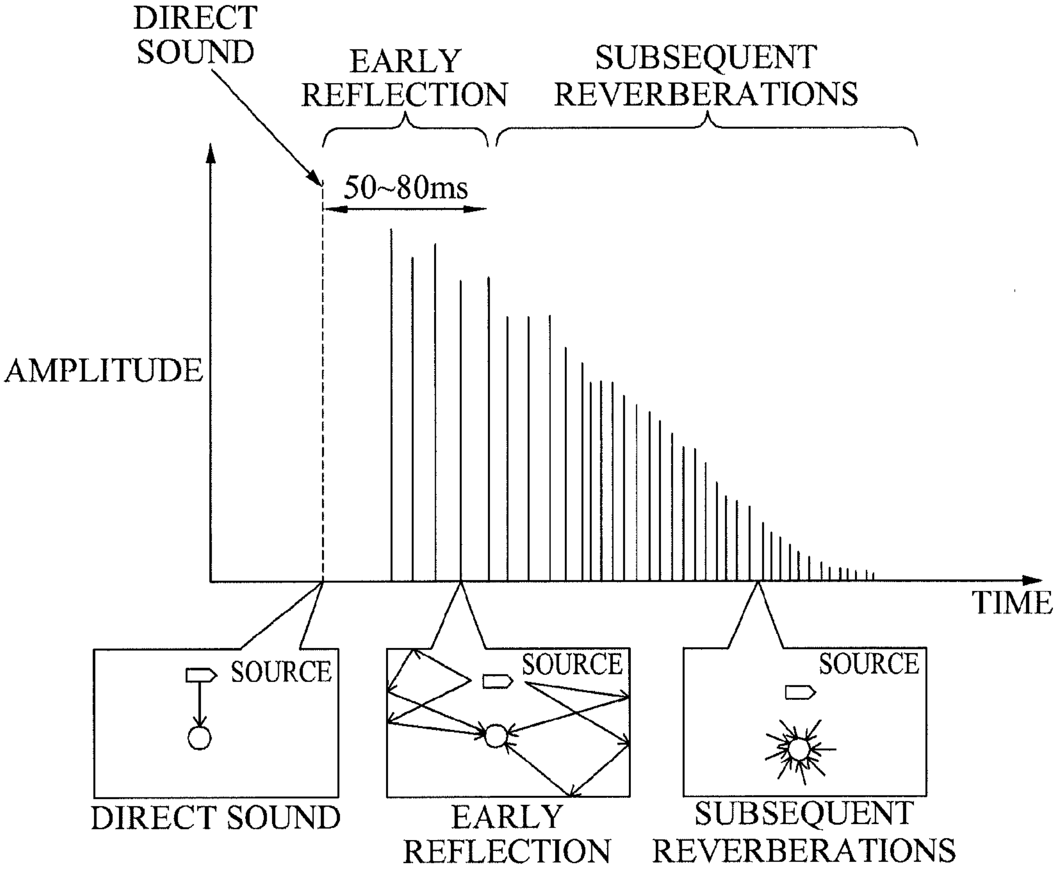
FIG. 3 illustrates a reverberation signal derived from an original signal, according to example embodiments.

FIG. 3 illustrates a reverberation signal derived from an original signal, according to example embodiments, Referring to FIG. 3, the original signal generated from a sound source may be delivered to a listener in the form of a direct sound that directly reaches the listener, and a reflected sound that is reflected from a surface in a space and then reaches the listener. Out of the reflection sound, a subsequent reflection sound that reaches the listener in a predetermined time is referred to as reverberation. The reverberation is an essential factor in determining characteristics of a space to which the sound source belongs.

The example embodiments may provide a spatial impression to the original signal by artificially applying a reverberation effect to the original signal.

Figure 4:
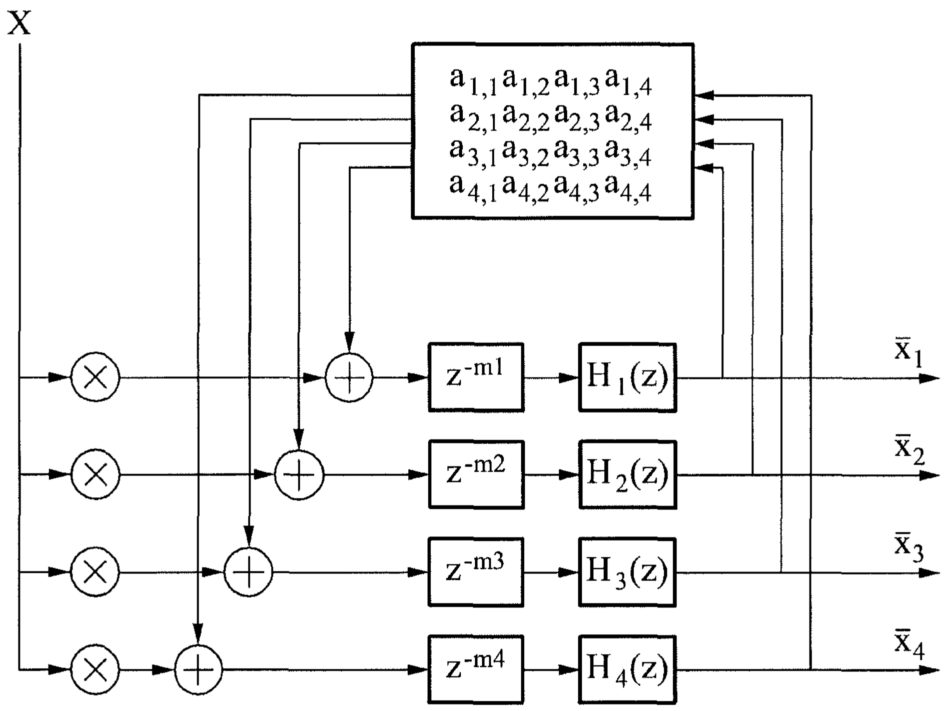
FIG. 4 illustrates a process of applying a reverberation effect, according to example embodiments.

FIG. 4 illustrates a process of applying a reverberation effect, according to example embodiments.

For example, FIG. 4 shows a fourth FDN that may apply the reverberation effect to an original signal. The FDN may achieve a natural reverberation effect while requiring a relatively small memory capacity. Specifically, the FDN may use a parallel comb filter to achieve reverberation density of a high temporal region, with a relatively small delay.

Referring to FIG. 4, an input signal X may be separated into a plurality of channels, multiplied by proper gains $b_1$, $b_2$, $b_3$, and $b_4$ in the respective channels, and summed together with a result value fed back through a matrix A. Next, the delay is applied to the summed signal, according to the channels.

The summed signal applied with the delay is passed through a low-pass filter $H_n(z)$.

The summed signal passed through the low-pass filter may be passed through the matrix A and then fed back. The foregoing process may be expressed by Equation 1.

$$\bar{x}_n(t) = H_n(t) * q_n(t),\ 1 \le i \le N$$ Equation 1

$$q_j(t+m_j) = \sum_{i=1}^{N} a_{ij} \cdot \bar{x}_i(t) + b_j \cdot x(t),\ 1 \le j \le N$$

$$A = \begin{bmatrix} a_{11} & a_{12} & a_{13} & a_{14} \\ a_{21} & a_{22} & a_{23} & a_{24} \\ a_{31} & a_{32} & a_{33} & a_{34} \\ a_{41} & a_{42} & a_{43} & a_{44} \end{bmatrix} = \frac{g}{\sqrt{2}} \begin{bmatrix} 0 & 1 & 1 & 0 \\ -1 & 0 & 0 & -1 \\ 1 & 0 & 0 & -1 \\ 0 & 1 & -1 & 0 \end{bmatrix} (g < 1)$$

Here, $\bar{x}_n(t)$ refers to a final output value to which the reverberation effect is applied, according to the FDN channels applied with the low-pass filter $H_n(z)$. $q_j(t+m_j)$ refers to a summed signal before the delay is applied.

$$\sum_{i=1}^{N} a_{ij} \cdot \bar{x}_i(t)$$

refers to the signal fed back through the matrix A. $b_j \cdot x(t)$ refers to a result value calculated by applying the gain $b_j$ to the input signal. In addition, A refers to the matrix.

The low-pass filter may be expressed using Equation 2.

$$H_p(z) = k_p \cdot \frac{1 - b_p}{1 - b_p z^{-1}}$$ Equation 2

Here, $k_p$ and $b_p$ are filter coefficients.

The FDN has been suggested to apply the reverberation effect to the original signal in the example embodiments. However, other structures of a reverberation algorithm may also be applied.

Figure 5:
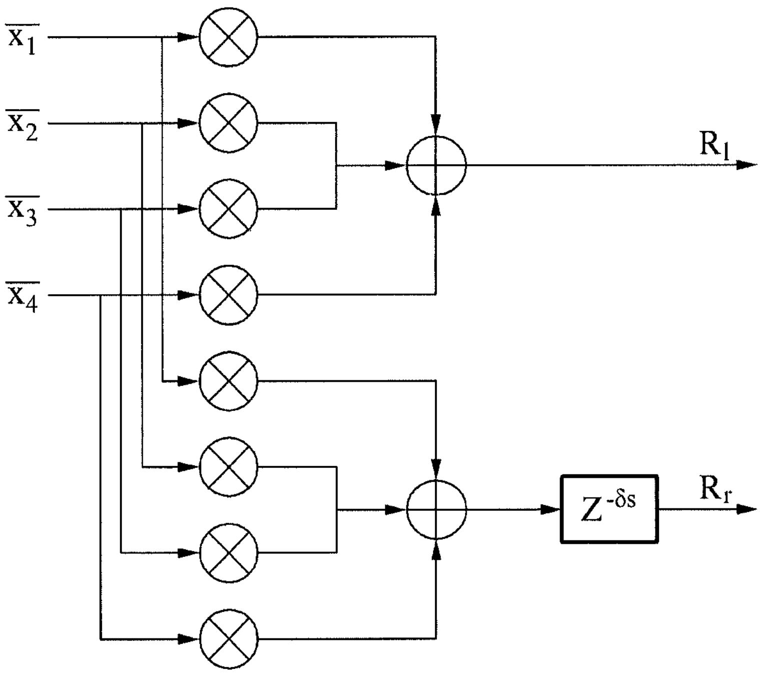
FIG. 5 illustrates a process of removing a correlation, according to example embodiments.

FIG. 5 illustrates a process of removing a correlation, according to example embodiments.

Referring to FIG. 5, in the case that original signals are stereo signals including a left channel and a right channel, the correlation may be removed from a summed signal to which the reverberation effect is applied, so that the original signal is divided into a left reverberation signal and a right reverberation signal.

In FIG. 5, the signal processing apparatus may generate the left reverberation signal and the right reverberation signal, by multiplying gains by the respective FDN channels and summing the multiplied values. Here, the gains with respect to the respective FDN channel signals may be selectively applied, according to a left correlation and a right correlation. Next, the right channel is delayed by $\delta_s$ from the summed signal applied with the reverberation effect, thereby extracting the right reverberation signal. In addition, the left channel is bypassed, thereby extracting the left reverberation signal. However, on the contrary, the signal processing apparatus may delay the left channel while bypassing the right channel.

When an N-number of locations of sound sources exist, the signal processing apparatus may delay the summed signal applied with the reverberation effect N−1 times, thereby extracting the N-number of reverberation signals.

Figure 6:
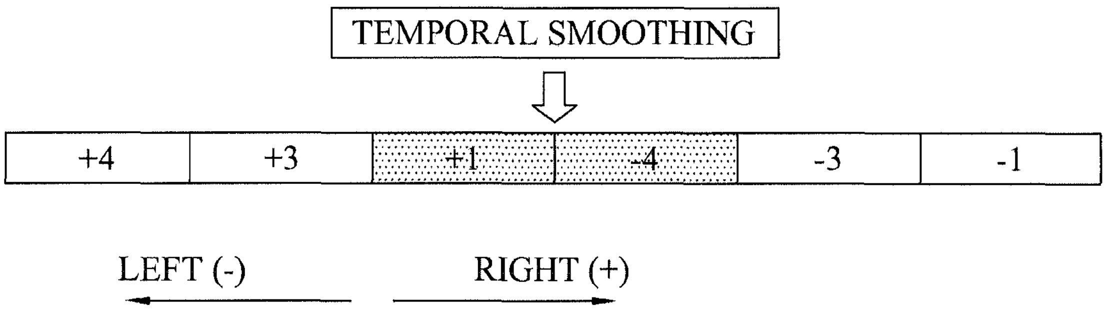
FIG. 6 illustrates a process of applying temporal smoothing, according to example embodiments.

FIG. 6 illustrates a process of applying temporal smoothing, according to example embodiments.

For example, the signal processing apparatus may extract energies of original signals in order to determine panning information of the original signals. FIG. 6 will be described presuming that the original signals are stereo signals including signals generated from a left sound source and a right sound source.

Energies $E_l$ and $E_r$ related to a left original signal $X_l$ and a right original signal $X_r$, respectively, may be calculated using Equation 3.

$$E_l = \sum_{i=0}^{L-1} x_l^2(i),\ E_r = \sum_{i=0}^{L-1} x_r^2(i)$$ Equation 3

The signal processing apparatus may determine the panning information of the left original signal and the right original signal by applying the energies $E_l$ and $E_r$ to Equation 4.

$$P_l = \begin{cases} \frac{E_l}{E_l + E_r}, & E_r + E_l \neq 0 \\ \sqrt{\frac{1}{2}}, & E_r + E_l = 0 \end{cases}$$ Equation 4

$$P_r = \sqrt{1 - P_l^2}$$

Panning information $P_l$ and $P_r$ are information related to directivity of the original signals, that is, a degree of leftward inclination or rightward inclination of the original signal with respect to a reference location.

For example, when $P_l$ is greater than $P_r$, the original signal is inclined to the left from the reference location. When $P_r$ is greater than $P_l$, the original signal is inclined to the right from the reference location. Here, the panning information may be calculated in units of a frame.

When panning information abruptly changes between frames, thereby causing transition to the reverberation signal applied with the panning information, a noise may be generated. The signal processing apparatus may apply temporal smoothing to reduce the generated noise.

FIG. 6 shows the panning information of each frame. When the panning information has a negative value, it means that the original signal is inclined to the left from the reference location. When the panning information has a positive value, the original signal is inclined to the right from the reference location. In this case, when the predetermined reference value is 2, the transition may occur between shadowed frames in FIG. 6. In this case, the signal processing apparatus may apply the temporal smoothing between the frames, to reduce a difference in the panning information between the frames.

Figure 7:
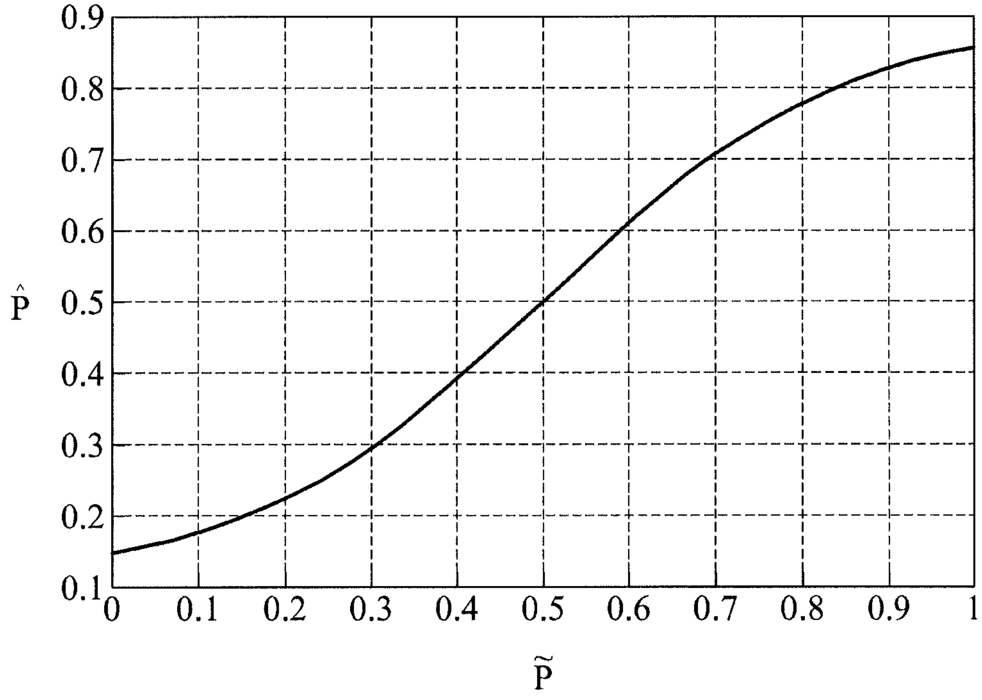
FIG. 7 illustrates a process of applying nonlinear mapping, according to example embodiments.

FIG. 7 illustrates a process of applying nonlinear mapping, according to example embodiments.

FIG. 7 will be described presuming that original signals are stereo signals including signals generated from a left sound source and a right sound source. The signal processing apparatus may apply temporal smoothing to nonlinearly mapped panning information. The signal processing apparatus may apply temporal smoothing using Equation 5 as follows.

$$\tilde{P}_l(n) = \alpha \cdot P_l + (1-\alpha) \cdot \hat{P}_l(n-1)$$

$$\tilde{P}_r(n) = \alpha \cdot P_r + (1-\alpha) \cdot \hat{P}_r(n-1)$$ Equation 5

Here, n refers to a frame index, $\hat{P}_l$ and $\hat{P}_r$ refer to nonlinearly mapped panning information, α refers to a coefficient representing a smoothing intensity. When α is increased, the temporal smoothing intensity is decreased. When α is decreased, the temporal smoothing intensity is increased.

According to Equation 5, panning information $\tilde{P}_l$ and $\tilde{P}_r$ applied with the temporal smoothing may be transformed through the nonlinear mapping. The coefficient α may be more increased or decreased by the nonlinear mapping, between a limited maximum value and minimum value of the panning information.

The nonlinearly mapped panning information may be determined by Equation 6.

$$\hat{P}_l = \frac{\mu_1 - \mu_0}{2}\tanh\{\sigma\pi(\tilde{P}_l - P_0)\} + \frac{\mu_1 + \mu_0}{2}$$ Equation 6

$$\hat{P}_r = \frac{\mu_1 - \mu_0}{2}\tanh\{\sigma\pi(\tilde{P}_r - P_0)\} + \frac{\mu_1 + \mu_0}{2}$$

Here, $\mu_0$ and $\mu_1$ refer to coefficient values representing the minimum value and the maximum value of the nonlinearly mapped panning information. $P_0$ refers to a shifting degree of the nonlinear mapping. σ refers to a slope of the nonlinear mapping.

FIG. 7 shows relations between the panning information applied with the nonlinear mapping and panning information not applied with the nonlinear mapping when $\mu_0$ and $\mu_1$ are 0.1 and 0.9, respectively.

Figure 8:
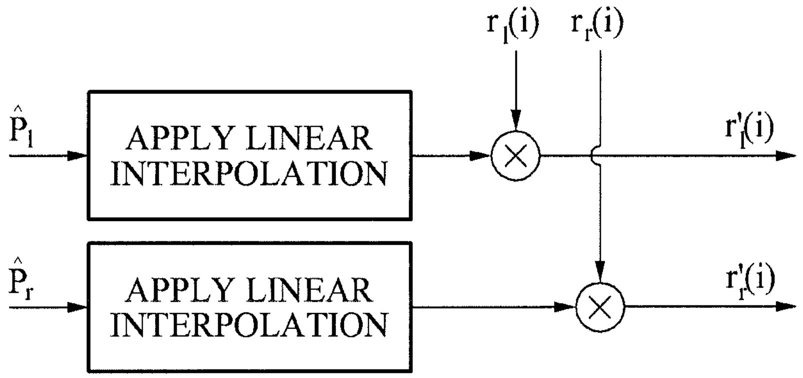
FIG. 8 illustrates a process of applying panning information to reverberation signals, according to example embodiments.

FIG. 8 illustrates a process of applying panning information to reverberation signals, according to example embodiments.

A signal processing apparatus may apply the panning information, applied with temporal smoothing and nonlinear mapping, to the respective reverberation signals that correspond to locations of an N-number of sound sources. FIG. 8 illustrates a case in which original signals are stereo signals including signals generated from a left sound source and a right sound source.

In the signal processing apparatus, panning information of a current frame may be linearly interpolated using panning information of a previous frame. The linear interpolation may be performed, according to Equation 7.

$$pcoeff_l(i) = \frac{\hat{P}_l(n) - \hat{P}_l(n-1)}{L} i + \hat{P}_l(n-1)$$ Equation 7

$$pcoeff_r(i) = \frac{\hat{P}_r(n) - \hat{P}_r(n-1)}{L} i + \hat{P}_r(n-1),$$

$$i = 0, \ldots, L-1$$

Here, n and L respectively refer to a frame index and a number of samples of a frame.

Therefore, the linearly interpolated panning information may be generated as a vector having the same length as the number of samples of a frame. The signal processing apparatus may apply the panning information to reverberation signals $R_l$ and $R_r$ in units of the sample of the frame, as expressed by Equation 8 below.

$$r'_l(i) = pcoeff_l(i) r_l(i),$$

$$r'_r(i) = pcoeff_r(i) r_r(i) \; i=0, \ldots, L-1$$ Equation 8

Figure 9:
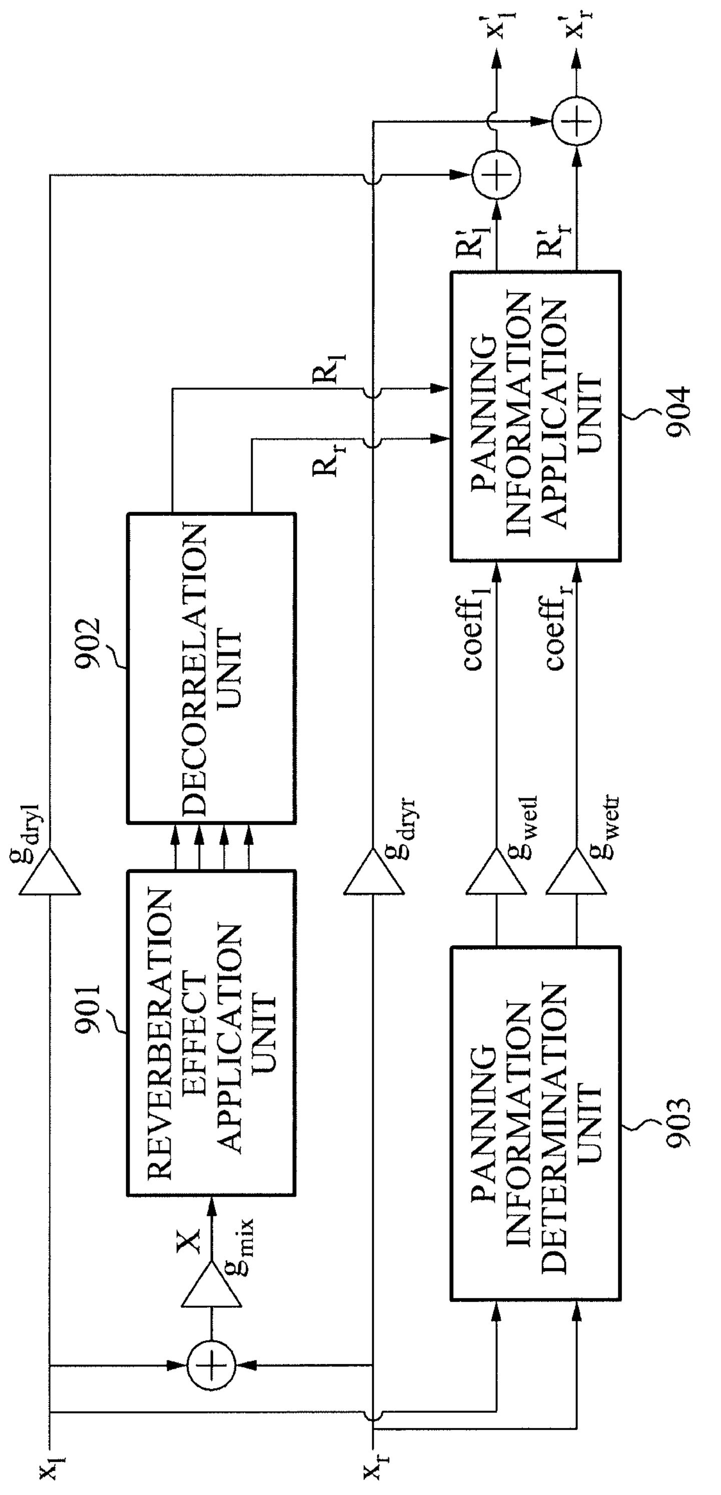
FIG. 9 illustrates a process of applying a reverberation effect to a left signal and a right signal, according to example embodiments.

FIG. 9 illustrates a process of applying a reverberation effect to a left signal and a right signal, according to example embodiments;

FIG. 9 will be illustrated about a case in which original signals are stereo signals, including signals generated from a left sound source and a right sound source.

First, a left original signal x, and a right original signal $x_r$ are summed, thereby generating a summed signal X multiplied by a gain $g_{mix}$. When the gain $g_{mix}$ is large, a large reverberation signal is outputted. When the gain $g_{mix}$ is small, a small reverberation signal is outputted.

The reverberation effect application unit 901 may generate an FDN 4-channel reverberation signal R through an FDN structure, based on the summed signal X. The decorrelation unit 902 removes a correlation from the FDN 4-channel reverberation signal R, thereby converting the FDN 4-channel reverberation signal R into a left reverberation signal $R_l$ and a right reverberation signal $R_r$ each having a stereo image. Here, location information of the sound sources based on energy of the left original signal and the right original signal are not reflected to the left reverberation signal $R_l$ and the right reverberation signal $R_r$. Therefore, the signal processing apparatus may reflect the location information of the sound sources to the left reverberation signal $R_l$ and the right reverberation signal $R_r$, respectively.

The panning information determination unit 903 may determine panning information corresponding to the location information of the left original signal $x_l$ and the right original signal $x_r$. In this case, the panning information may be determined in units of a frame. The determined panning information may be multiplied by gains $g_{wetl}$ and $g_{wetr}$ that controls intensity of the reverberation signals. Accordingly, panning information $coeff_l$, related to the left original signal and panning information, related to the right original signal $coeff_r$, may be derived.

The panning information application unit 904 may apply the panning information $coeff_l$ and $coeff_r$ to the reverberation signals $R_l$ and $R_r$, respectively. Here, temporal smoothing may be applied to the panning information to prevent an occurrence of transition in the reverberation signals due to a sudden difference in the panning information between frames.

The left reverberation signal $R'_l$ and the right reverberation signal $R'_r$, to which the panning information are reflected, are respectively mixed with a result value of multiplying the left original signal $x_l$ by the a $g_{dryl}$ and a result value of multiplying the right original signal $x_r$ by a gain $g_{dryr}$. Accordingly, a left final signal $x'_l$ and a right final signal $x'_r$, applied with the spatial impression, are outputted.

Here, the gains $g_{dryl}$ and $g_{dryr}$ are used to control the intensity of the direct sound in the left final signal $x'_l$ and the right final signal $x'_r$. More specifically, when the gains $g_{dryl}$ and $g_{dryr}$ are increased while the gains $g_{wetl}$ and $g_{wetr}$ are reduced, the direct sound is intensified and a clear original signal is outputted. When the gains are controlled in the opposite manner, a sound with a high spatial impression is outputted.

Figure 10:
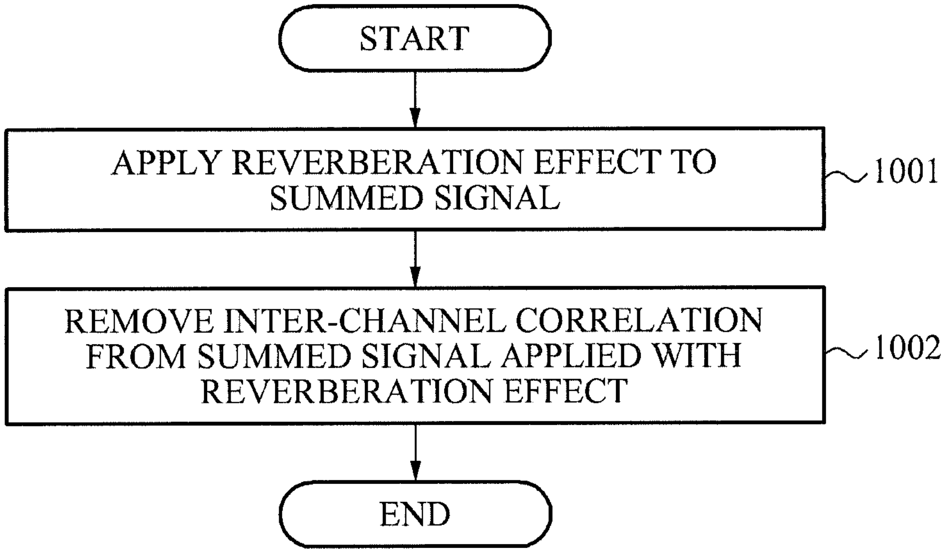
FIG. 10 illustrates a signal processing method, according to example embodiments.

FIG. 10 illustrates a signal processing method, according to example embodiments.

In operation 1001, a reverberation effect application unit 101 of the signal processing apparatus 100 may apply the reverberation effect to a summed signal formed by summing original signals corresponding to locations of an N-number of sound sources. For example, the reverberation effect application unit 101 may apply the reverberation effect to the summed signal using an N-th FDN.

According to the example embodiments, a relatively small memory capacity is required since the reverberation effect is applied to the summed signal formed by summing the original signals, corresponding to the locations of the N-number of channels.

In operation 1002, the decorrelation unit 102 of the signal processing apparatus 100 may extract reverberation signals, corresponding to the locations of the N-number of sound sources, by removing a correlation from an FDN channel signal applied with the reverberation effect. For example, the decorrelation unit 102 may apply a delay to the summed signal, applied with the reverberation effect, to thereby extract the reverberation signals corresponding to the locations of the N-number of sound sources.

Figure 11:
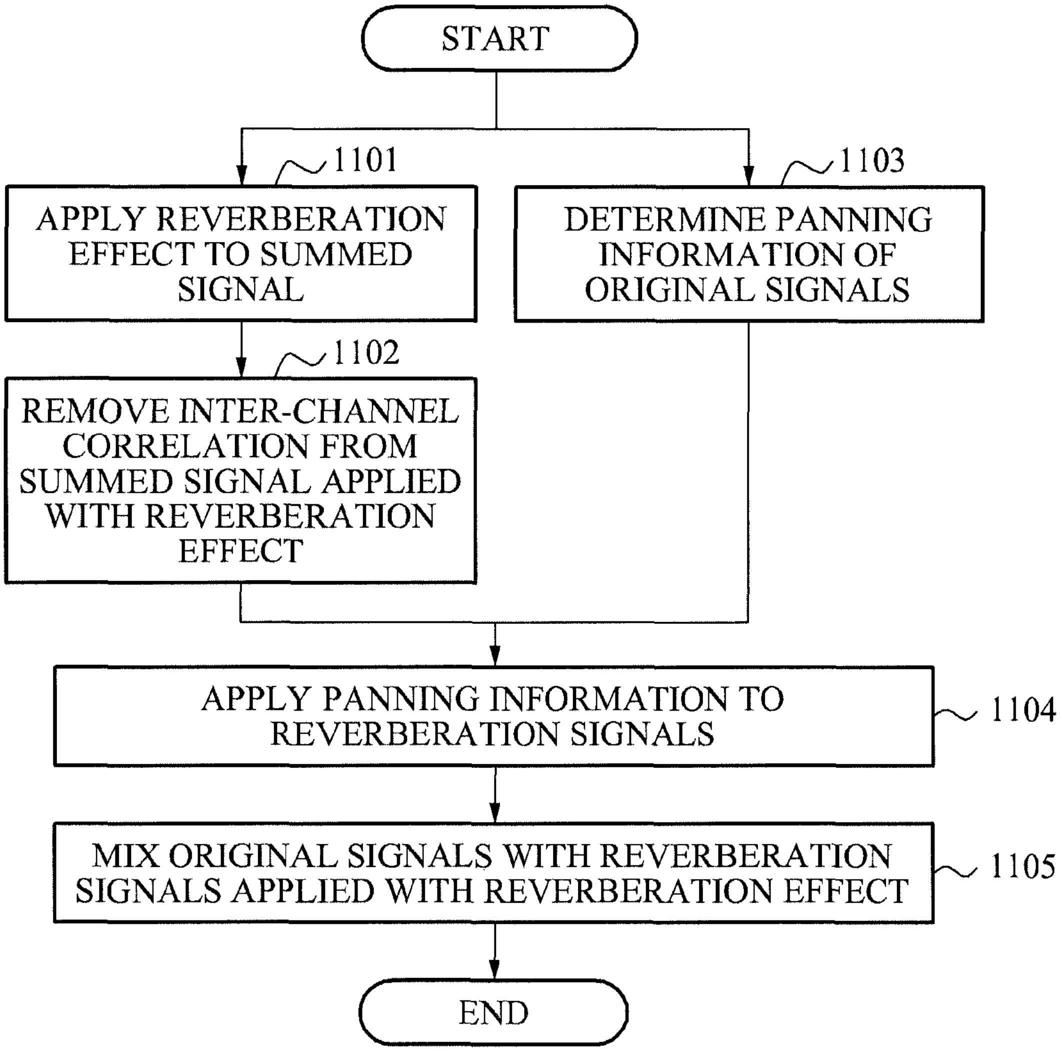
FIG. 11 illustrates a signal processing method, according to other example embodiments.

FIG. 11 illustrates a signal processing method, according to other example embodiments.

In operation 1101, the reverberation effect application unit 201 of the signal processing apparatus 200 may apply the reverberation effect to a summed signal formed by summing original signals corresponding to locations of an N-number of sound sources. For example, the reverberation effect application unit 201 may apply the reverberation effect to the summed signal using an N-th FDN.

In operation 1102, the decorrelation unit 202 of the signal processing apparatus 200 may extract reverberation signals corresponding to the locations of the N-number of sound sources, by removing a correlation from an FDN channel signal applied with the reverberation effect. For example, the decorrelation unit 202 may multiply gains, according to channels, by the respective FDN channel signals applied with the reverberation effect, and sum the multiplied values. In addition, the decorrelation unit 202 may apply a delay to the summed FDN channel signal, thereby extracting the reverberation signals, corresponding to the locations of the N-number of sound sources.

In operation 1103, the panning information determination unit 203 of the signal processing apparatus 200 may determine panning information of the respective original signals, corresponding to the locations of the N-number of sound sources. Here, the panning information refers to the panning coefficient, that is, information on location information of the original signals. For example, the panning information determination unit 203 may determine the panning information representing directivity of the original signals using energies of the respective original signals that correspond to the locations of the N-number of sound sources. Here, the panning information determination unit 203 may determine the panning information of the original signals for each frame of each of the original signals.

In operation 1104, the panning information application unit 204 of the signal processing apparatus 200 may apply the panning information to the respective original signals corresponding to the locations of the N-number of sound sources. Here, the reverberation signals refer to signals derived from the decorrelation unit 202. That is, the panning information application unit 205 may reflect directivity of the original signals to the reverberation signals, by applying the panning information to the respective reverberation signals.

Here, when transition occurs, since a panning information difference between frames exceeds a predetermined reference value, the panning information application unit 204 may apply temporal smoothing to the panning information between frames. By applying the panning information applied with the temporal smoothing to the reverberation signals, the panning information application unit 204 may reduce a noise caused by the transition. In addition, the panning information application unit 204 may apply nonlinear mapping to the panning information applied with the temporal smoothing. The nonlinear mapping is performed to limit a maximum value and a minimum value of panning while adjusting the panning intensity.

In operation 1105, the signal mixing unit 205 may mix the original signals, corresponding to the locations of the N-number of sound sources with the reverberation signals applied with the panning information. Accordingly, the signal mixing unit 205 may derive final signals corresponding to the N-number of channels.

The methods according to the above-described example embodiments may be recorded in non-transitory computer-readable media including program instructions to implement various operations embodied by a computer. The media may also include, alone or in combination with the program instructions, data files, data structures, and the like. The program instructions recorded on the media may be those specially designed and constructed for the purposes of the example embodiments, or they may be of the kind well-known and available to those having skill in the computer software arts. Examples of the non-transitory computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW.

Further, according to an aspect of the embodiments, any combinations of the described features, functions and/or operations can be provided.

Moreover, the signal processing apparatus 100, as shown in FIG. 1, for example, may include at least one processor to execute at least one of the above-described units and methods.

Although example embodiments have been shown and described, it would be appreciated by those skilled in the art that changes may be made in these example embodiments without departing from the principles and spirit of the disclosure, the scope of which is defined in the claims and their equivalents.

What is claimed is:

1. A signal processing apparatus, comprising:

a reverberation effect application unit to apply a reverberation effect to a summed signal formed by summing original signals that correspond to locations of an N-number of sound sources;

a decorrelation unit to extract reverberation signals corresponding to the locations of the N-number of sound sources, by removing correlation from the summed signal to which the reverberation effect is applied;

a panning information determination unit to determine panning information of the original signals; and a panning information application unit to apply the panning information to the reverberation signals.

2. The signal processing apparatus of claim 1, wherein the panning information determination unit determines the panning information representing directivity of the original signals using energies of the original signals that correspond to the locations of the N-number of sound sources.

3. The signal processing apparatus of claim 1, wherein the panning information determination unit determines the panning information of the respective original signals corresponding to the locations of the N-number of sound sources for each frame of each original signal.

4. The signal processing apparatus of claim 1, wherein the panning information application unit applies temporal smoothing with respect to the panning information when a panning information difference between frames exceeds a predetermined reference value.

5. The signal processing apparatus of claim 4, wherein the panning information application unit applies nonlinear mapping with respect to the panning information applied with the temporal smoothing.

6. The signal processing apparatus of claim 1, wherein the reverberation effect application unit applies the reverberation effect to the summed signal using an N-th feedback delay network (FDN).

7. The signal processing apparatus of claim 1, wherein the decorrelation unit multiplies a gain by a feedback delay network (FDN) channel signal applied with the reverberation effect and applies a delay to the summed signal of the FDN channel signals multiplied with the gain, thereby extracting the reverberation signals corresponding to the locations of the N-number of sound sources.

8. The signal processing apparatus of claim 1, further comprising a signal mixing unit to mix the original signals corresponding to the locations of the N-number of sound sources with the reverberation signals applied with the panning information.

9. A signal processing method, comprising:

applying a reverberation effect to a summed signal formed by summing original signals that correspond to locations of an N-number of sound sources;

extracting reverberation signals corresponding to the locations of the N-number of sound sources, by removing correlation from the summed signal to which the reverberation effect is applied;

determining panning information of the original signals; and applying the panning information to the reverberation signals.

10. The signal processing method of claim 9, wherein the determining of the panning information comprises determining the panning information representing directivity of the original signals using energies of the original signal that correspond to the locations of the N-number of sound sources.

11. The signal processing method of claim 9, wherein the determining of the panning information comprises determining the panning information of the respective original signals corresponding to the locations of the N-number of sound sources for each frame of each original signal.

12. The signal processing method of claim 9, wherein the applying of the panning information comprises applying temporal smoothing with respect to the panning information when a panning information difference between frames exceeds a predetermined reference value.

13. The signal processing method of claim 12, wherein the applying of the panning information comprises applying nonlinear mapping with respect to the panning information applied with the temporal smoothing.

14. The signal processing method of claim 9, wherein the applying of the reverberation effect comprises applying the reverberation effect to the summed signal using an N-th feedback delay network (FDN).

15. The signal processing method of claim 9, wherein the extracting of the reverberation signals corresponding to the locations of the N-number of sound sources by removing the correlation comprises:

multiplying a gain by a feedback delay network (FDN) channel signal applied with the reverberation effect, and applying a delay to the summed signal of the FDN channel signals multiplied with the gain.

16. The signal processing method of claim 9, further comprising mixing of the original signals corresponding to the locations of the N-number of sound sources with the reverberation signals applied with the panning information.

17. A non-transitory computer readable recording medium storing a program to cause a computer to implement the method of claim 9.

18. A signal processing method, comprising:

increasing a spatial impression of one or more original signals by adding a reverberation effect to the one or more original signals;

extracting reverberation signals by removing correlation from a feedback delay network (FDN) channel signal to which the reverberation effect is applied; and maintaining a directivity of the one or more original signals by applying panning information of the one or more original signals to the reverberation signals.

* * * * *